(12) United States Patent
Xu et al.

(10) Patent No.: US 11,937,473 B2
(45) Date of Patent: Mar. 19, 2024

(54) DISPLAY PANEL AND DISPLAY APPARATUS (71) Applicant: KunShan Go-Visionox Opto-Electronics Co., Ltd, Jiangsu (CN)

(72) Inventors: Chuanzhi Xu, Kunshan (CN); Huiling Lu, Kunshan (CN); Zhengfang Xie, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 136 days.

(21) Appl. No.: 17/713,548

(22) Filed: Apr. 5, 2022

(65) Prior Publication Data
US 2022/0231113 A1 Jul. 21, 2022

Related U.S. Application Data (63) Continuation of application No. PCT/CN2020/123966, filed on Oct. 27, 2020.

(30) Foreign Application Priority Data

Apr. 2, 2020 (CN) .......................... 202010254217.0

(51) Int. Cl.
*H10K 59/131* (2023.01)
*H10K 59/121* (2023.01)
(52) U.S. Cl.
CPC ......... *H10K 59/131* (2023.02); *H10K 59/121* (2023.02)
(58) Field of Classification Search
CPC .... H10K 59/131; H10K 59/121; H10K 59/65; H10K 59/12; H10K 59/126; G09G 3/3233
See application file for complete search history.

(56) References Cited

U.S. PATENT DOCUMENTS

2015/0279918 A1 10/2015 Teraguchi et al.
2018/0114823 A1* 4/2018 Lee ...................... H10K 59/126

FOREIGN PATENT DOCUMENTS

CN 108010944 A 5/2018
CN 109697958 A 4/2019
(Continued)

OTHER PUBLICATIONS

First Office Action dated Jul. 29, 2022 issued in Chinese Application No. 202010254217.0, with Concise Explanation of Relevance in English, 12 pages.
(Continued)

*Primary Examiner* — Grant Sitta
(74) *Attorney, Agent, or Firm* — Maier & Maier, PLLC (57) ABSTRACT

The display panel includes a first display area, and the display panel includes: a substrate; a first light-emitting element disposed on the substrate and disposed in the first display area; a first driving transistor disposed between the substrate and the first light-emitting element, the first driving transistor being electrically connected with the first light-emitting element and including a first gate; a first conductive line unit electrically connected with the first gate and disposed on a side of the first gate away from the substrate; and a first power supply structure electrically connected with a first electrode of the first light-emitting element and disposed between the first conductive line unit and the first electrode of the first light-emitting element, an orthographic projection of the first power supply structure on the substrate covering an orthographic projection of the first conductive line unit on the substrate.

15 Claims, 6 Drawing Sheets

(56) References Cited

FOREIGN PATENT DOCUMENTS

| CN | 109786425 | A |   | 5/2019  |            |
|----|-----------|---|---|---------|------------|
| CN | 109887985 | A |   | 6/2019  |            |
| CN | 110047895 | A |   | 7/2019  |            |
| CN | 110148610 | A |   | 8/2019  |            |
| CN | 110265458 | A |   | 9/2019  |            |
| CN | 110299384 | A |   | 10/2019 |            |
| CN | 104766875 | B |   | 12/2019 |            |
| CN | 110610684 | A |   | 12/2019 |            |
| CN | 110752246 | A |   | 2/2020  |            |
| CN | 110783384 | A |   | 2/2020  |            |
| CN | 110783385 | A |   | 2/2020  |            |
| CN | 210120137 | U |   | 2/2020  |            |
| CN | 210200763 | U |   | 3/2020  |            |
| CN | 210200763 | U | * | 3/2020  |            |
| CN | 109697958 | B | * | 11/2020 | G09G 3/3208 |
| CN | 113451360 | A |   | 9/2021  |            |

OTHER PUBLICATIONS

The International search report for PCT Application No. PCT/CN2020/123966, dated Feb. 2, 2021, 10 pages.

\* cited by examiner

DISPLAY PANEL AND DISPLAY APPARATUS

CROSS REFERENCE TO RELATED APPLICATION

The present application is a continuation of International Application No. PCT/CN2020/123966 filed on Oct. 27, 2020, which claims priority to Chinese Patent Application No. 202010254217.0 filed on Apr. 2, 2020, both of which are incorporated herein by reference in their entireties.

TECHNICAL FIELD

The present application relates to the field of display technology, and particularly to a display panel and a display apparatus.

BACKGROUND

Organic Light-Emitting Diode (Organic Light-Emitting Diode, OLED) display apparatuses are widely used in various consumer electronics such as mobile phones, TVs, personal digital assistants, digital cameras, notebook computers and desktop computers for high image quality, power saving, thin body and wide application and the like, which have become the mainstream of display applications.

In order to satisfy various demands of users, in the prior art, sub-pixels in a variety of structures are designed on the display panel, but sub-pixels in a variety of structures are affected differently by other film layer structures, resulting in that the uniformity of light-emitting brightness of the sub-pixels is not good, and the display effect of the display panel is affected.

SUMMARY

The present application provides a display panel and a display apparatus, which is able to improve the display effect of the display panel.

In one aspect, the embodiments of the present application provide a display panel comprising a first display area, the display panel comprising: a substrate; a first light-emitting element disposed on the substrate and disposed in the first display area, the first light-emitting element comprising a first electrode, a first light-emitting layer disposed on the first electrode, and a second electrode disposed on the first light-emitting layer; a first driving transistor disposed between the substrate and the first light-emitting element, the first driving transistor being electrically connected with the first light-emitting element and comprising a first gate; a first conductive line unit electrically connected with the first gate and disposed on a side of the first gate away from the substrate; and a first power supply structure electrically connected with the first electrode and disposed between the first conductive line unit and the first electrode, an orthographic projection of the first power supply structure on the substrate covering an orthographic projection of the first conductive line unit on the substrate.

In another aspect, the embodiments of the present application further provide a display apparatus comprising the display panel of the first aspect.

According to the display panel and the display apparatus provided by the embodiments of the present application, the display panel includes a substrate, a first light-emitting element, a first driving transistor, a first conductive line unit, and a first power supply structure. Herein, the first driving transistor is electrically connected with the first light-emitting element to drive the first light-emitting element to emit light and display, and the first conductive line unit is electrically connected with the first gate of the first light-emitting element, so as to electrically connect an electrical signal terminal such as an initialization signal terminal with the first gate, thereby facilitating the initialization of the first gate.

The first power supply structure is electrically connected with the first electrode to supply power to the first light-emitting element. Herein, the first power supply structure is disposed between the first conductive line unit and the first electrode, and since the first power supply structure can provide stable signals, the first power supply structure can shield the first conductive line unit due to an orthographic projection of the first power supply structure on the substrate covers an orthographic projection of the first conductive line unit on the substrate, a generation of the parasitic capacitance due to the coupling between the first electrode and the first conductive line unit is prevented, so as to achieve the display uniformity for the various light-emitting elements in the first display area and improve the display effect of the display panel.

DETAILED DESCRIPTION

Features and exemplary embodiments of various aspects of the present application will be described in detail below. To make the objects, technical solutions, and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details. The following description of the embodiments is merely to provide a better understanding of the present application by illustrating the examples of the present application.

It is understood that when describing the structure of a component, if a layer or area is described as "on" or "above" another layer or area, it may mean that the layer or area is directly on another layer or area, or other layers or areas may be between the layer or area and another layer or area. Moreover, if the component is turned over, the layer or area will be "below" or "under" another layer or area.

Features and exemplary embodiments of various aspects of the present application will be described in detail below. In addition, the features, structures, or characteristics described below may be combined in one or more embodiments in any suitable manner.

In an electronic device such as a cell phone and a tablet computer, it is needed to integrate a photosensitive component such as a front camera, an infrared light sensor, and a proximity light sensor at the side of the display panel. In some embodiments, a light-transmitting display area may be arranged in the above electronic device, and the photosensitive component is arranged on the rear of the light-transmitting display area. A full-screen display is achieved for the electronic device while the photosensitive component is guaranteed to work normally.

In order to increase the transmittance of the light-transmitting display area, the pixel density of the light-transmitting display area is generally set to be small, and the number of wirings in the light-transmitting display area is reduced. Nonetheless, with the change of the pixel structure or wiring position in the light-transmitting display area, parasitic capacitance is generated due to the coupling between the anode of each sub-pixel and the corresponding pixel driving circuit, for example, between the anode of each sub-pixel and the gate of the driving transistor, resulting in that the light-emitting brightness of sub-pixels with different colors are not uniform.

To solve the above problems, the embodiments of the present application provide a display panel 100 and a display apparatus, which will be described in detail below with reference to FIGS. 1 to 12.

The embodiments of the present application provide a display panel 100, which may be an organic light emitting diode (Organic Light Emitting Diode, OLED) display panel 100.

Figure 1:
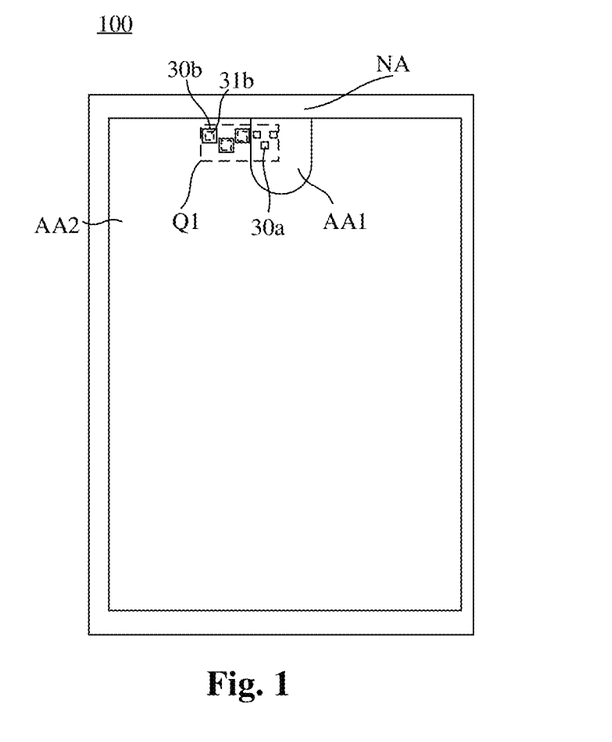
FIG. 1 shows a top view of a display panel provided by an embodiment of the present application.
Figure 2:
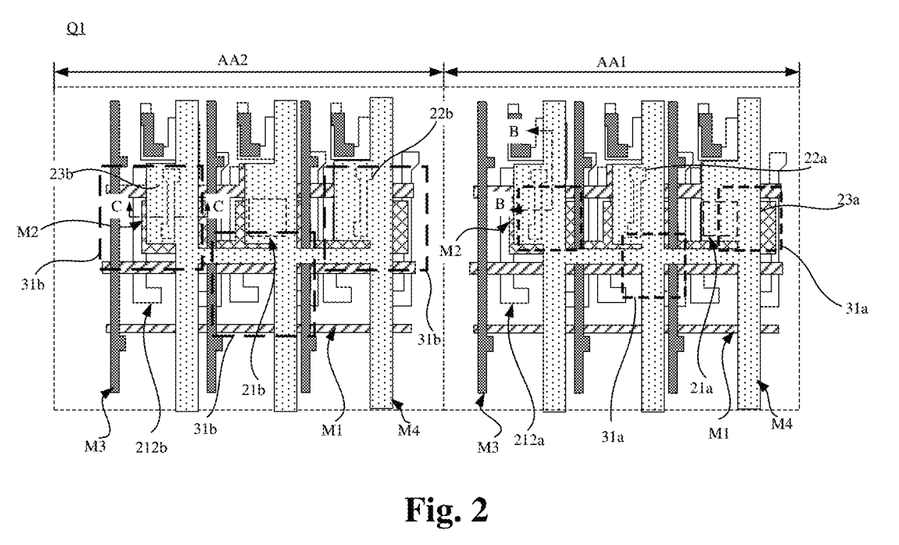
FIG. 2 shows an enlarged schematic diagram of area Q1 of the display panel as shown in FIG. 1.
Figure 3:
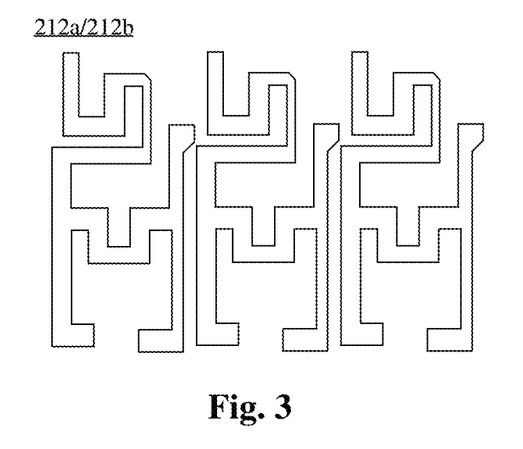
FIG. 3 shows a top view of a first active layer and a second active layer provided by an embodiment of the present application.
Figure 4:
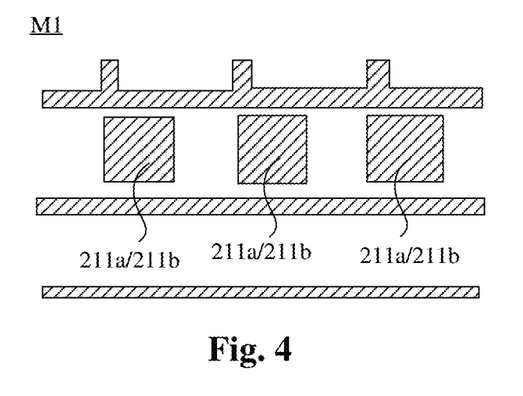
FIG. 4 shows a top view of a first conductive layer provided by an embodiment of the present application.
Figure 5:
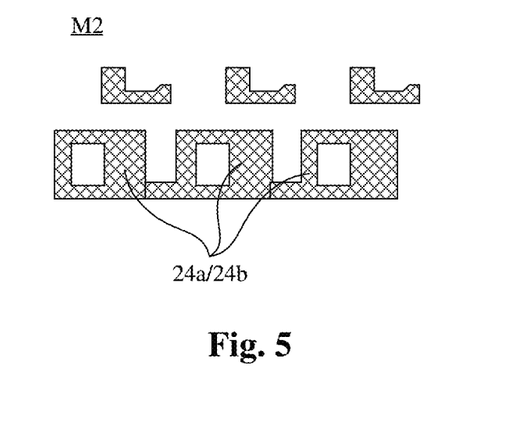
FIG. 5 shows a top view of a second conductive layer provided by an embodiment of the present application.
Figure 6:
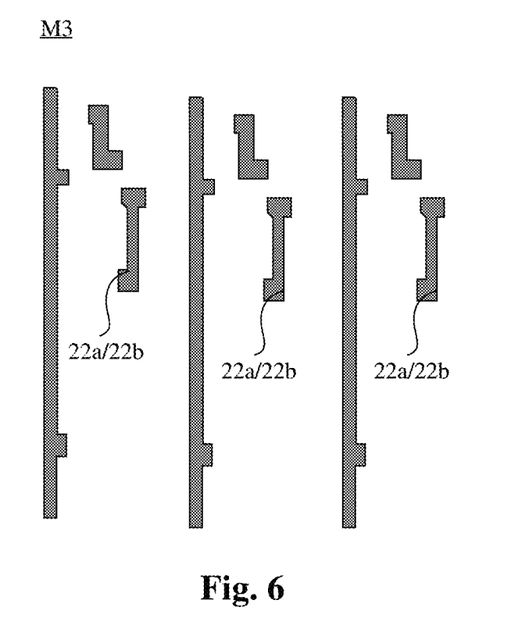
FIG. 6 shows a top view of a third conductive layer provided by an embodiment of the present application.
Figure 7:
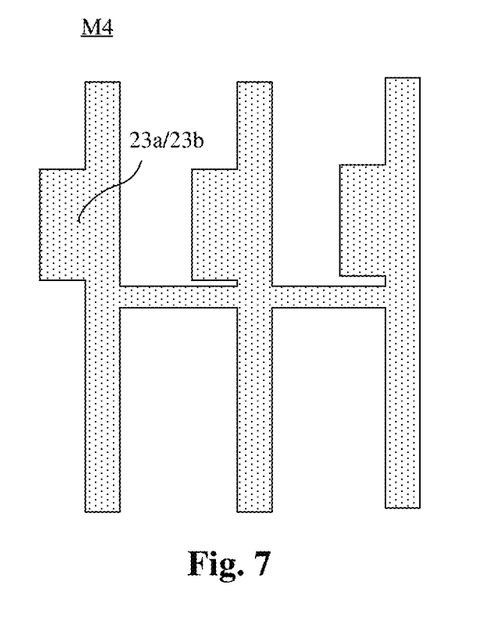
FIG. 7 shows a top view of a fourth conductive layer provided by an embodiment of the present application.

Please refer to FIGS. 1 to 7 together, in which FIG. 1 shows a top view of a display panel provided by an embodiment of the present application, FIG. 2 shows an enlarged schematic diagram of area Q1 of the display panel as shown in FIG. 1, FIG. 3 shows a top view of a first active layer and a second active layer provided by an embodiment of the present application, FIG. 4 shows a top view of a first conductive layer provided by an embodiment of the present application, FIG. 5 shows a top view of a second conductive layer provided by an embodiment of the present application, FIG. 6 shows a top view of a third conductive layer provided by an embodiment of the present application, and FIG. 7 shows a top view of a fourth conductive layer provided by an embodiment of the present application. Herein, the filling lines with the same color are used in the drawings to indicate that the film layer structures are manufactured in the same layer, the specific structures of each film layer are exemplary, and those who are skilled in the art can make improvements according to requirements.

The embodiments of the present application provide a display panel 100 including a first display area AA1. The display panel 100 includes a substrate 10, a first light-emitting element 30a, a first driving transistor 21a, a first conductive line unit 22a, and a first power supply structure 23a. The first light-emitting element 30a is disposed on the substrate 10 and disposed in the first display area AA1, and the first light-emitting element 30a includes a first electrode 31a, a first light-emitting layer 32a disposed on the first electrode 31a, and a second electrode 33a disposed on the first light-emitting layer 32a. The first driving transistor 21a is disposed between the substrate 10 and the first light-emitting element 30a, and the first driving transistor 21a is electrically connected with the first light-emitting element 30a and includes a first gate 211a. The first conductive line unit 22a is electrically connected with the first gate 211a and disposed on a side of the first gate 211a away from the substrate 10. The first power supply structure 23a is electrically connected with the first electrode 31a and disposed between the first conductive line unit 22a and the first electrode 31a, and an orthographic projection of the first power supply structure 23a on the substrate 10 covers an orthographic projection of the first conductive line unit 22a on the substrate 10.

Herein, one of the first electrode 31a and the second electrode 33a is an anode, and the other is a cathode. In the present application, for example, the first electrode 31a is the anode and the second electrode 33a is the cathode. It can be understood that the display panel 100 further includes a pixel defining layer 40 which includes a plurality of first pixel openings, and the first light-emitting layer 32a is filled into the first pixel opening. The display panel may include a plurality of first light-emitting elements 30a with different colors, for example, a red first light-emitting element 30a, a green first light-emitting element 30a, and a blue first light-emitting element 30a.

If the arrangement structure of the first light-emitting elements 30a is not exactly the same as the arrangement structure of the first driving transistors 21a, for example, the first electrodes 31a of the plurality of first light-emitting elements 30a in FIG. 2 may be arranged as a Chinese character "A", while the plurality of first driving transistors 21a may be arranged in an array along the row direction and the column direction of the display panel 100, the orthographic projection of at least part of the first electrodes 31a on the substrate 10 overlaps the orthographic projection of the first conductive line unit 22a on the substrate 10 to form a first projection pattern. In such a case, if there is no other conductive film layer structure disposed between the at least part of the first electrodes 31a and the first conductive line unit 22a whose orthographic projections overlapping each other, parasitic capacitance is generated due to the coupling between the first electrode 31a and the first conductive line unit 22a. In the embodiments of the present application, the orthographic projection of the first power supply structure 23a on the substrate 10 covers the orthographic projection of the first conductive line unit 22a on the substrate 10, the orthographic projection of the first power supply structure 23a on the substrate 10 covers the first projection pattern, which can effectively prevent the coupling between the first electrode 31a and the first conductive line unit 22a, thereby preventing the parasitic capacitance from changing the voltage of the first gate 211a electrically connected with the first conductive line unit 22a, and thereby prevent from affecting the brightness of each first light-emitting element 30a.

According to the display panel 100 provided by the embodiments of the present application, the first power supply structure 23a is disposed between the first conductive line unit 22a and the first electrode 31a, and since the first power supply structure 23a can provide stable signals, the first power supply structure 23a can shield the first conductive line unit 22a due to the orthographic projection of the first power supply structure 23a on the substrate 10 covers the orthographic projection of the first conductive line unit 22a on the substrate 10, a generation of the parasitic capacitance due to the coupling between the first electrode 31a and the first conductive line unit 22a is prevented, so as to achieve the display uniformity for the various light-emitting elements in the first display area AA1 and improve the display effect of the display panel 100.

Optionally, the display panel 100 further includes the substrate 10 and a device layer 20 disposed on the substrate 10, and the device layer 20 includes a driving circuit for driving the first light-emitting element 30a to emit light and display, a wiring layer, and other structures. For example, the device layer 20 includes the first driving transistor 21a, the first conductive line unit 22a, and the first power supply structure 23a disposed on the substrate 10.

Figure 8:
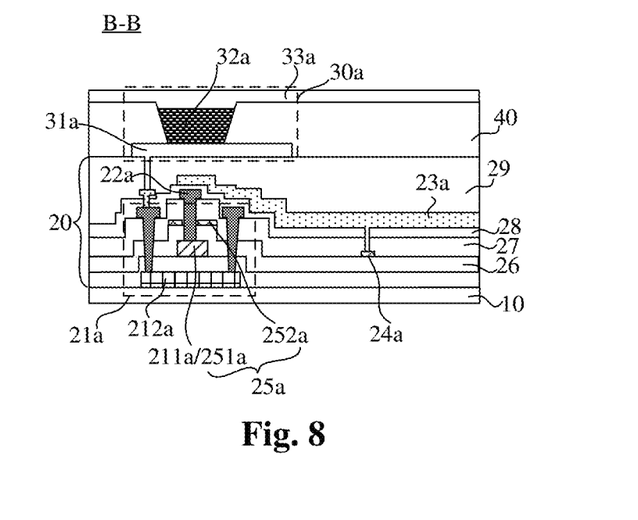
FIG. 8 shows a cross-sectional view taken along the direction B-B in FIG. 2.

Please refer to FIGS. 2, 5, and 8, in which FIG. 8 shows a cross-sectional view taken along the direction B-B in FIG. 2. In some embodiments, the display panel 100 further includes a first auxiliary power supply structure 24a disposed between the first gate 211a and the first conductive line unit 22a, and the first power supply structure 23a is electrically connected with the first auxiliary power supply structure 24a. With the above arrangement, the first auxiliary power supply structure 24a and the first power supply structure 23a are manufactured in two layers, and compared with the case that the first auxiliary power supply structure 24a and the first power supply structure 23a are manufactured in the same layer, the size of the first auxiliary power supply structure 24a and the first power supply structure 23a along the plane of the display panel 100 can be effectively reduced, thus the size of the display panel 100 can be reduced, or a high pixel density (Pixels Per Inch, PPI) can be achieved relative to the display panel 100 with the same size.

In some embodiments, the display panel 100 further includes a first capacitor 25a including a first electrode plate 251a and a second electrode plate 252a facing to each other, the first electrode plate 251a and the first gate 211a are arranged in a same layer, and the second electrode plate 252a is disposed between the first gate 211a and the first conductive line unit 22a, and the first power supply structure 23a is electrically connected with the second electrode plate 252a. With the above arrangement, the second electrode plate 252a and the first power supply structure 23a are manufactured in two layers, and compared with the case that the second electrode plate 252a and the first power supply structure 23a are manufactured in the same layer, the size of the second electrode plate 252a and the first power supply structure 23a along the plane of the display panel 100 can be effectively reduced, the size of the display panel 100 can be reduced, or a high PPI can be achieved relative to the display panel 100 with the same size. Moreover, the first power supply structure 23a is electrically connected with the second electrode plate 252a to charge the first capacitor 25a.

In some embodiments, a four-layers metal (4Metal) process may be used in the manufacturing process of the display panel 100, so that the display panel 100 includes a first conductive layer M1, a second conductive layer M2, a third conductive layer M3, and a fourth conductive layer M4 which are arranged in sequence along a direction away from the substrate 10, which facilitates to manufacture some wiring film layer structures in two layers and reduce the plane size of the display panel 100, or achieve a high PPI relative to the display panel 100 with the same size. FIGS. 4 to 7 show the structure diagrams of the various conductive layers, in which the first gate 211a may be formed in the first conductive layer M1 and the first electrode plate 251a of the first capacitor 25a may be formed in the first conductive layer M1, the first auxiliary power supply structure 24a may be formed in the second conductive layer M2, the first conductive line unit 22a may be formed in the third conductive layer M3, and the first power supply structure 23a is formed in the fourth conductive layer M4.

Insulating dielectric layers are further arranged among the various conductive layers to prevent short circuits among the various conductive layers. A planarization layer 29 is further arranged between the fourth conductive layer M4 and the various light-emitting elements to facilitate to manufacture stable film layer structures of the light-emitting element. In specific implementations, the display panel 100 further includes a first dielectric layer 26 disposed between the first conductive layer M1 and the second conductive layer M2, a second dielectric layer 27 disposed between the second conductive layer M2 and the third conductive layer M3, and a third dielectric layer 28 arranged between the third conductive layer M3 and the fourth conductive layer M4.

It should be noted that "a first auxiliary power supply structure 24a disposed between the first gate 211a and the first conductive line unit 22a" as described in the present application is defined based on that in the thickness direction of the display panel 100, the second conductive layer M2 in which the first auxiliary power supply structure 24a is located is disposed between the first conductive layer M1 in which the first gate 211a is located and the third conductive layer M3 in which the first conductive line unit 22a is located. "The second electrode plate 252a is disposed between the first gate 211a and the first conductive line unit 22a" is defined based on that the second conductive layer M2 in which second electrode plate 252a is located is disposed between the first conductive layer M1 in which the first gate 211a is located and the third conductive layer M3 in which the first conductive line unit 22a is located.

Figure 9:
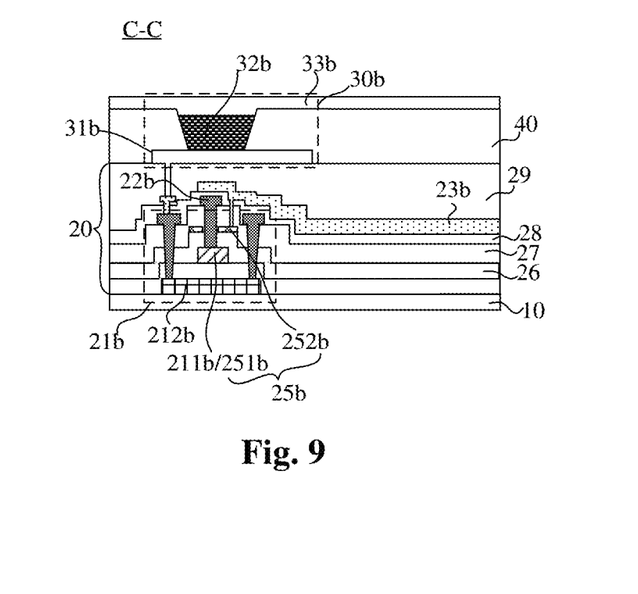
FIG. 9 shows a cross-sectional view taken along the direction C-C in FIG. 2.

Please refer to FIGS. 1 to 9, in which FIG. 9 shows a cross-sectional view taken along the direction C-C in FIG. 2. In some embodiments, the display panel 100 further includes a second display area AA2, a pixel density of the second display area AA2 is greater than a pixel density of the first display area AA1, and the display panel 100 further includes a second light-emitting element 30b, a second driving transistor 21b, a second conductive line unit 22b, and a second power supply structure 23b. The second light-emitting element 30b is disposed on the substrate 10 and disposed in the second display area AA2, and the second light-emitting element 30b includes a third electrode 31b, a second light-emitting layer 32b disposed on the third electrode 31b, and a fourth electrode 33b disposed on the second light-emitting layer 32b. The second driving transistor 21b is disposed in the second display area AA2 and disposed between the substrate 10 and the second light-emitting element 30b, and the second driving transistor 21b is electrically connected with the second light-emitting element 30b and includes a second gate 211b. The second conductive line unit 22b is electrically connected with the second gate 211b and disposed on a side of the second gate 211b away from the substrate 10. The second power supply structure 23b is electrically connected with the third electrode 31b and disposed between the second conductive line unit 22b and the third electrode 31b, and an orthographic projection of the second power supply structure 23b on the substrate 10 covers an orthographic projection of the second conductive line unit 22b on the substrate 10.

Herein, one of the third electrode 31b and the fourth electrode 33b is an anode, and the other is a cathode. In the present application, for example, the third electrode 31b is the anode and the fourth electrode 33b is the cathode. It can be understood that if the display panel 100 further includes the pixel defining layer 40, the pixel defining layer 40 includes a plurality of second pixel openings, and the second light-emitting layer 32b is filled into the second pixel opening. The display panel includes a plurality of second light-emitting elements 30b with different colors, for example, a red second light-emitting element 30b, a green second light-emitting element 30b, and a blue second light-emitting element 30b.

With the above arrangement, the pixel density of the first display area AA1 is smaller than the pixel density of the second display area AA2, thus the transmittance of the first display area AA1 is greater than the transmittance of the second display area AA2, so that a photosensitive component can be integrated on the rear of the display panel 100, and an under-screen integration is achieved for the photosensitive component such as a camera. The second conductive line unit 22b is electrically connected with the second gate 211b, so as to electrically connect an electrical signal terminal such as an initialization signal terminal with the second gate 211b, thereby facilitating the initialization of the second gate 211b.

Further, the second power supply structure 23b is disposed between the second conductive line unit 22b and the third electrode 31b, and since the second power supply structure 23b can provide stable signals, the second power supply structure 23b can shield the second conductive line unit 22b due to the orthographic projection of the second power supply structure 23b on the substrate 10 covers the orthographic projection of the second conductive line unit 22b on the substrate 10, a generation of the parasitic capacitance due to the coupling between the third electrode 31b and the second conductive line unit 22b is prevented, so as to achieve the display uniformity for the various light-emitting elements in the second display area AA2 and improve the display effect of the display panel 100. Moreover, since the conductive line units corresponding the gates can be shielded in both the first display area AA1 and the second display area AA2, the display brightness of the first display area AA1 and the second display area AA2 are uniform, and the display effect of the display panel 100 is improved.

Still further, if the arrangement structure of the second light-emitting elements 30b is not exactly the same as the arrangement structure of the second driving transistors 21b, for example, the third electrodes 31b of the plurality of second light-emitting elements 30b in FIG. 2 may be arranged as a Chinese character "A", while the plurality of second driving transistors 21b may be arranged in an array along the row direction and the column direction of the display panel 100, the orthographic projection of at least part of the third electrodes 31b on the substrate 10 overlaps the orthographic projection of the second conductive line unit 22b on the substrate 10 to form a second projection pattern. If there is no other conductive film layer structure disposed between the at least part of the third electrodes 31b and the second conductive line unit 22b whose orthographic projections overlapping each other, parasitic capacitance is generated due to the coupling between the third electrode 31b and the second conductive line unit 22b. In the embodiments of the present application, the orthographic projection of the second power supply structure 23b on the substrate 10 covers the orthographic projection of the second conductive line unit 22b on the substrate 10, and in such a case, the orthographic projection of the second power supply structure 23b on the substrate 10 covers the second projection pattern, which can effectively prevent the coupling between the third electrode 31b and the second conductive line unit 22b, thereby preventing the parasitic capacitance from changing the voltage of the second gate 211b electrically connected with the second conductive line unit 22b, and thereby prevent from affecting the brightness of each second light-emitting element 30b.

Since the pixel density of the first display area AA1 is different from the pixel density of the second display area AA2, the second projection pattern is likely to be different from the first projection pattern, resulting in that the coupling situation between the third electrode 31b of the second light-emitting element 30b and the second conductive line unit 22b is different from the coupling situation between the first electrode 31a of the first light-emitting element 30a and the first conductive line unit 22a. Therefore, when the second display area AA2 and the first display area AA1 display the same white image, the best gamma (Gamma) parameter needs to be adjusted to keep the brightness of the two display areas consistent, but when the white image is switched to a single-color image, the display brightness of the first display area AA1 and the display brightness of the second display area AA2 will also be different. To solve the above problems, in the embodiments of the present application, the orthographic projection of the first power supply structure 23a on the substrate 10 covers the first projection pattern, and the orthographic projection of the second power supply structure 23b on the substrate 10 covers the second projection pattern, so that there is no coupling between the first electrode 31a and the first gate 211a in the first display area AA1, and there is no coupling between the third electrode 31b and the second gate 211b in the second display area AA2, thereby avoiding changes of the voltage of the first gate 211a and the voltage of the second gate 211b, so that the brightness of the two display areas are uniform.

Please continue to refer to FIGS. 2, 5, and 9. For a high PPI of the display panel 100 or reducing the plane size of the display panel 100, when the display panel 100 includes the second power supply structure 23b, the display panel 100 further includes a second auxiliary power supply structure 24b disposed between the second gate 211b and the second conductive line unit 22b, and the second power supply structure 23b is electrically connected with the second auxiliary power supply structure 24b. The electrical connection manner between the second power supply structure 23b and the second auxiliary power supply structure 24b is similar to the electrical connection manner between the first power supply structure 23a and the first auxiliary power supply structure 24a. Specifically, the electrical connection structure between the second power supply structure 23b and the second auxiliary power supply structure 24b may be the same as the electrical connection structure between the first power supply structure 23a and the first auxiliary power supply structure 24a as shown in FIG. 8.

In some embodiments, the display panel 100 further includes a second capacitor 25b disposed in the second display area AA2 and including a third electrode plate 251b and a fourth electrode plate 252b facing to each other, the third electrode plate 251b and the second gate 211b are arranged in a same layer, as shown in FIG. 9, the fourth electrode plate 252b is disposed between the second gate 211b and the second conductive line unit 22b, and the second power supply structure 23b is electrically connected with the fourth electrode plate 252b. With the above arrangement, the fourth electrode plate 252b and the second power supply structure 23b are manufactured in two layers, and compared with the case that the fourth electrode plate 252b and the second power supply structure 23b are manufactured in the same layer, the size of the fourth electrode plate 252b and the second power supply structure 23b along the plane of the display panel 100 can be effectively reduced, thus the size of the display panel 100 can be reduced, or a high PPI can be achieved relative to the display panel 100 with the same size.

Figure 10:
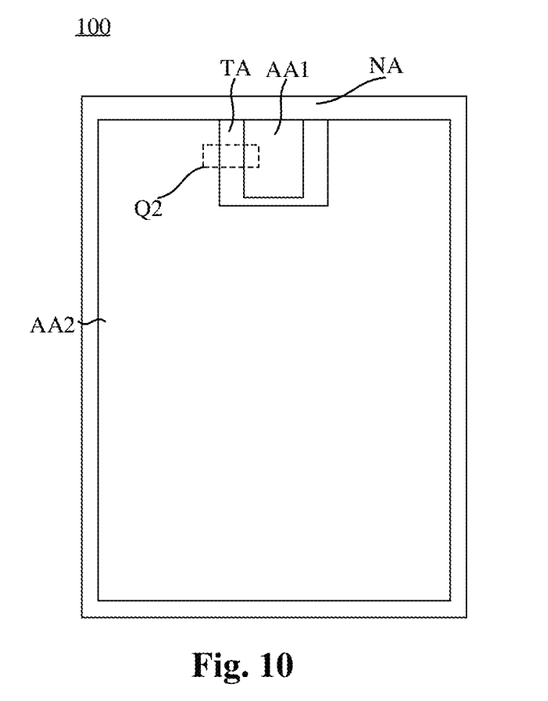
FIG. 10 shows a top view of a display panel provided by another embodiment of the present application.
Figure 11:
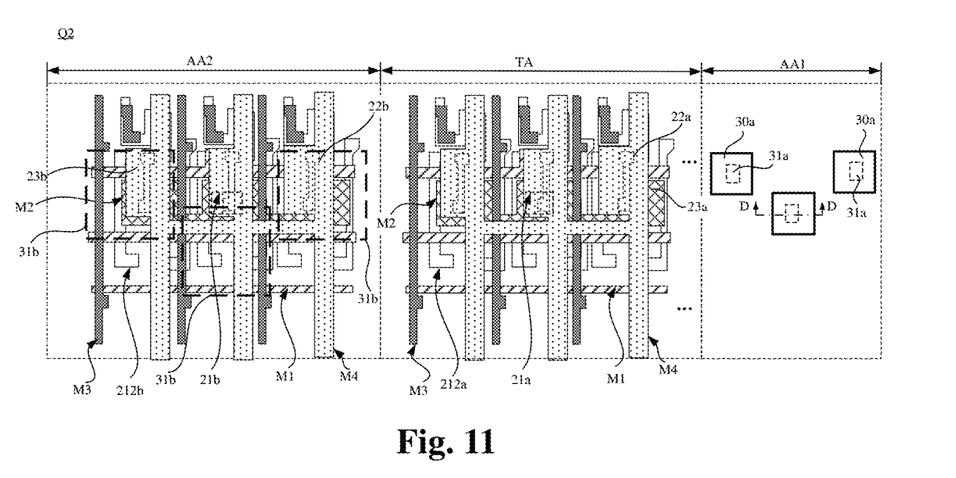
FIG. 11 shows an enlarged schematic diagram of area Q2 in FIG. 10.
Figure 12:
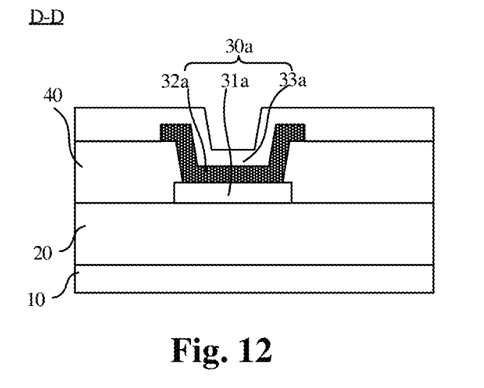
FIG. 12 shows a cross-sectional view taken along the direction D-D in FIG. 11.

Please further refer to FIGS. 10 to 12.

In order to further increase the transmittance of the first display area AA1, in some embodiments, the display panel 100 further includes a transition display area TA disposed between the first display area AA1 and the second display area AA2, and the first driving transistor 21a is disposed in the transition display area TA. Optionally, the first conductive line unit 22a may also be disposed in the transition display area TA, and the first capacitor 25a may also be disposed in the transition display area TA. By arranging some wiring structures in the transition display area TA, the number of wirings in the first display area AA1 can be effectively reduced, the light transmittance of the first display area AA1 is increased, and the performance of the photosensitive component disposed under the display panel 100 is improved. Optionally, the display panel 100 further includes a non-display area NA arranged at the periphery of the first display area AA1, the second display area AA2, and the transition display area TA.

When the display panel 100 includes the transition display area TA, in order to achieve a full-screen display for the display panel 100, the display panel 100 further includes a third light-emitting element, a third driving transistor, a third conductive line unit, and a third power supply structure. The third light-emitting element is disposed on the substrate 10 and disposed in the transition display area TA, and the third light-emitting element includes a fifth electrode, a third light-emitting layer disposed on the fifth electrode, and a sixth electrode disposed on the third light-emitting layer. The third driving transistor is disposed in the transition display area TA and disposed between the substrate 10 and the third light-emitting element, and the third driving transistor is electrically connected with the third light-emitting element and includes a third gate. The third conductive line unit is electrically connected with the third gate and disposed on a side of the third gate away from the substrate 10. The third power supply structure is electrically connected with the fifth electrode and disposed between the third conductive line unit and the fifth electrode, and an orthographic projection of the third power supply structure on the substrate 10 covers an orthographic projection of the third conductive line unit on the substrate 10. Herein, the structures and positions of the third light-emitting element, the third driving transistor, the third conductive line unit, and the third power supply structure are similar to those of the second light-emitting element, the second driving transistor, the second conductive line unit, and the second power supply structure, which will not be repeated.

Herein, one of the fifth electrode and the sixth electrode is an anode, and the other is a cathode. In the present application, for example, the fifth electrode is the anode and the sixth electrode is the cathode. It can be understood that the pixel defining layer 40 includes a plurality of third pixel openings, and the third light-emitting layer is filled into the third pixel opening. The display panel may include a plurality of third light-emitting elements with different colors, for example, a red third light-emitting element, a green third light-emitting element, and a blue third light-emitting element.

With the above arrangement, the third power supply structure is disposed between the third conductive line unit and the fifth electrode, and since the third power supply structure can provide stable signals, the third power supply structure can shield the third conductive line unit due to the orthographic projection of the third power supply structure on the substrate 10 covers the orthographic projection of the third conductive line unit on the substrate 10, a generation of the parasitic capacitance due to the coupling between the fifth electrode and the third conductive line unit is prevented, so as to achieve the display uniformity for the various light-emitting elements in the transition display area TA. Moreover, when both of the first driving transistor 21a and the third light-emitting element are arranged in the transition display area TA, since the third power supply structure shields the third conductive line unit, a generation of the parasitic capacitance due to the coupling between the fifth electrode of the third light-emitting element and the first conductive line unit 22a corresponding to the first driving transistor 21a in the transition display area TA can be further prevented, so as to improve the display effect of the display panel 100.

For a high PPI of the display panel 100 or reducing the plane size of the display panel 100, when the display panel 100 includes the third power supply structure, the display panel 100 further includes a third auxiliary power supply structure disposed between the third gate and the third conductive line unit, and the third power supply structure is electrically connected with the third auxiliary power supply structure.

In some embodiments, the display panel 100 further includes a third capacitor disposed in the transition display area TA and including a fifth electrode plate and a sixth electrode plate facing to each other, the fifth electrode plate and the third gate are arranged in a same layer, the sixth electrode plate is disposed between the third gate and the third conductive line unit, and the third power supply structure is electrically connected with the sixth electrode plate. With the above arrangement, the sixth electrode plate and the third power supply structure are manufactured in two layers, and compared with the case that the sixth electrode plate and the third power supply structure are manufactured in the same layer, the size of the sixth electrode plate and the third power supply structure along the plane of the display panel 100 can be effectively reduced, the size of the display panel 100 can be reduced, or a high PPI can be achieved relative to the display panel 100 with the same size.

When the four-layer metal (4Metal) process is used for the display panel 100, the first gate 211a, the second gate 211b, and the third gate may be formed in the first conductive layer M1, and the first electrode plate 251a of the first capacitor 25a, the third electrode plate 251b of the second capacitor 25b, and the fifth third electrode plate 251b plate of the third capacitor may all be formed in the first conductive layer M1. The first auxiliary power supply structure 24a, the second auxiliary power supply structure 24b, the third auxiliary power supply structure, the second electrode plate 252a of the first capacitor 25a, the fourth electrode plate 252b of the second capacitor 25b, and the sixth electrode plate of the third capacitor may all be formed in the second conductive layer M2. The first conductive line unit 22a, the second conductive line unit 22b, and the third conductive line unit may all be formed in the third conductive layer M3. The first power supply structure 23a, the second power supply structure 23b, and the third power supply structure may all be formed in the fourth conductive layer M4. With the above arrangement, the size of the display panel 100 can be effectively reduced or the display panel 100 can have a high PPI. It may be understood that the various structures in the same conductive layer can be manufactured simultaneously, and the manufacturing process is simplified.

Herein, the first driving transistor 21a further includes a first active layer 212a, and the first gate 211a is disposed on the side of the first active layer 212a away from the substrate 10. The second driving transistor 21b further includes a second active layer 212b, and the second gate 211b is disposed on the side of the second active layer 212b away from the substrate 10. The third driving transistor further includes a third active layer, and the third gate is disposed on the side of the third active layer away from the substrate 10. Herein, the first active layer 212a, the second active layer 212b, and the third active layer may be manufactured in the same layer, and the specific structures of the first driving transistor 21a, the second driving transistor 21b, and the third driving transistor are not limited in the present application.

In order to achieve better display for various light-emitting elements disposed in the display panel 100, the gates of the driving transistors need to be initialized. In some embodiments, the first power supply structure 23a, the second power supply structure 23b, and the third power supply structure are all electrically connected to a reset signal terminal. Optionally, the first power supply structure 23a, the second power supply structure 23b, and the third power supply structure are anode power supply structures (VDD), and since the anode power supply structure can provide stable electrical signals, it can effectively shield the coupling between the anodes of various light-emitting elements and the gates of the driving transistors.

In the embodiment, for example, the first electrode 31a, the third electrode 31b, and the fifth electrode are anodes, and the second electrode 33a, the fourth electrode 33b, and the sixth electrode are cathodes.

The first light-emitting layer 32a, the second light-emitting layer 32b, and the third light-emitting layer each may include an OLED light-emitting layer. According to the design requirements of the first light-emitting layer 32a, the second light-emitting layer 32b, and the third light-emitting layer, each of them may also include at least one of a hole injection layer, a hole transport layer, an electron injection layer, or an electron transport layer.

In some embodiments, the first electrode 31a is a light-transmitting electrode. In some embodiments, the first electrode 31a includes a layer of indium tin oxide (Indium Tin Oxide, ITO) layer or a layer of indium zinc oxide. In some embodiments, the first electrode 31a is a reflective electrode, and includes a first light-transmitting conductive layer, a reflective layer disposed on the first light-transmitting conductive layer, and a second light-transmitting conductive layer disposed on the reflective layer. Herein, the first light-transmitting conductive layer and the second light-transmitting conductive layer may be ITO, indium zinc oxide, etc., and the reflective layer may be a metal layer, for example, made of silver. The third electrode 31b and the fifth electrode each may be configured to use the same material as the first electrode 31a.

In some embodiments, the second electrode 33a includes a magnesium-silver alloy layer. The fourth electrode 33b and the sixth electrode each may be configured to use the same material as the second electrode 33a. In some embodiments, the second electrode 33a, the fourth electrode 33b, and the sixth electrode are interconnected as a common electrode.

In some embodiments, an orthographic projection of each first light-emitting layer 32a on the substrate 10 includes one first graphic unit or at least two first graphic units jointed together, and the first graphic unit includes at least one selected from a group including a round shape, an oval shape, a dumb-bell shape, a gourd shape and a rectangle shape.

In some embodiments, an orthographic projection of each first electrode 31a on the substrate 10 includes one second graphic unit or at least two second graphic units jointed together, and the second graphic unit includes at least one selected from a group including a round shape, an oval shape, a dumb-bell shape, a gourd shape and a rectangle shape.

In some embodiments, an orthographic projection of each third light-emitting layer on the substrate 10 includes one third graphic unit or at least two third graphic units jointed together, and the third graphic unit includes at least one selected from a group including a round shape, an oval shape, a dumb-bell shape, a gourd shape and a rectangle shape.

In some embodiments, an orthographic projection of each fifth electrode on the substrate 10 includes one fourth graphic unit or at least two fourth graphic units jointed together, and the fourth graphic unit includes at least one selected from a group including a round shape, an oval shape, a dumb-bell shape, a gourd shape and a rectangle shape.

In summary, according to the display panel 100 and the display apparatus provided by the embodiments of the present application, the display panel 100 includes the substrate 10, the first light-emitting element 30a, the first driving transistor 21a, the first conductive line unit 22a, and the first power supply structure 23a. Herein, the first driving transistor 21a is electrically connected with the first light-emitting element 30a to drive the first light-emitting element 30a to emit light and display, and the first conductive line unit 22a is electrically connected with the first gate 211a, so as to electrically connect an electrical signal terminal such as an initialization signal terminal with the first gate 211a, thereby facilitating the initialization of the first gate 211a.

The first power supply structure 23a is electrically connected with the first electrode 31a to supply power to the first light-emitting element 30a. Herein, the first power supply structure 23a is disposed between the first conductive line unit 22a and the first electrode 31a, and since the first power supply structure 23a can provide stable signals, the first power supply structure 23a can shield the first conductive line unit 22a due to an orthographic projection of the first power supply structure 23a on the substrate 10 covers an orthographic projection of the first conductive line unit 22a on the substrate 10, a generation of the parasitic capacitance due to the coupling between the first electrode 31a and the first conductive line unit 22a is prevented, so as to achieve the display uniformity for the various light-emitting elements in the first display area AA1 and improve the display effect of the display panel 100.

In another aspect, the embodiments of the present application further provide a display apparatus including the display panel 100 of any one of the above embodiments. The display panel 100 includes the first display area AA1 in which the orthographic projection of the first power supply structure 23a on the substrate 10 covers the orthographic projection of the first conductive line unit 22a on the substrate 10, therefore the display effect of the first display area AA1 of the display panel 100 is improved.

Optionally, the display panel 100 further includes the second display area AA2, and the pixel density of the second display area AA2 is greater than the pixel density of the first display area AA1, so that the light transmittance of the first display area AA1 is greater than the light transmittance of the second display area AA2.

The display panel 100 includes a first surface and a second surface opposite to each other, in which the first surface is a display surface. The display apparatus further includes a photosensitive component located at the side of the display panel 100 where the second surface is located, and the photosensitive component corresponds to the position of the first display area AA1.

The photosensitive component may be an image capturing component for capturing external image information. In the embodiment, the photosensitive component is a complementary metal oxide semiconductor (Complementary Metal Oxide Semiconductor, CMOS) image capturing component, and in some other embodiments, the photosensitive component may also be other image capturing components such as a charge-coupled device (Charge-coupled Device, CCD) image capturing component. It may be appreciated that the photosensitive component may not be limited to an image capturing component. For example, in some embodiments, the photosensitive component may also be a light sensor such as an infrared sensor, a proximity sensor, an infrared lens, a flood light sensing element, an ambient light sensor and a dot projector. In addition, in the display apparatus, other components such as a telephone receiver and a speaker may also be integrated on the side of the display panel 100 where the second surface is located.

According to the display apparatus of the embodiments of the present application, the light transmittance of the first display area AA1 is greater than the light transmittance of the second display area AA2, so that the photosensitive component may be integrated on the rear of the first display area AA1 of the display panel 100. An under-screen integration is achieved for the photosensitive component such as an image capturing component, and moreover, the first display area AA1 can display the image, the display area of the display panel 100 is increased and a full-screen design is achieved for the display apparatus. In addition, the orthographic projection of the first power supply structure 23a on the substrate 10 covers the orthographic projection of the first conductive line unit 22a on the substrate 10, and the orthographic projection of the second power supply structure 23b on the substrate 10 covers the orthographic projection of the second conductive line unit 22b on the substrate 10, so that there is no coupling between the first gate 211a and the anode of the first light-emitting element 30a in the first display area AA1, and there is no coupling between the second gate 211b and the anode of the second light-emitting element 30b in the second display area AA2, which improves the uniformity of display brightness of the first display area AA1 and the second display area AA2, and prevents the un-uniformity of display brightness of the two display areas when the display panel 100 switches the image.

The above embodiments of the present application do not exhaustively describe all the details, nor do they limit the present application to merely the specific embodiments described. Obviously, according to the above description, many modifications and changes can be made. These embodiments are selected and specifically described in the specification to better explain the principles and practical applications of the present application, so that those skilled in the art can make good use of the present application and make modifications based on the present application. The present application is only defined by the claims and their full scope and equivalents.

What is claimed is:

1. A display panel, comprising a first display area and second display area, wherein a pixel density of the second display area is greater than a pixel density of the first display area, the display panel comprising:
   a substrate;
   a first light-emitting element disposed on the substrate and disposed in the first display area, the first light-emitting element comprising a first electrode, a first light-emitting layer disposed on the first electrode, and a second electrode disposed on the first light-emitting layer;
   a first driving transistor disposed between the substrate and the first light-emitting element, the first driving transistor being electrically connected with the first light-emitting element and comprising a first gate;
   a first conductive line unit electrically connected with the first gate and disposed on a side of the first gate away from the substrate;
   a first power supply structure electrically connected with the first electrode and disposed between the first conductive line unit and the first electrode, an orthographic projection of the first power supply structure on the substrate covering an orthographic projection of the first conductive line unit on the substrate;
   a second light-emitting element disposed on the substrate and disposed in the second display area, the second light-emitting element comprising a third electrode, a second light-emitting layer disposed on the third electrode, and a fourth electrode disposed on the second light-emitting layer;
   a second driving transistor disposed in the second display area and disposed between the substrate and the second light-emitting element, the second driving transistor being electrically connected with the second light-emitting element and comprising a second gate;
   a second conductive line unit electrically connected with the second gate and disposed on a side of the second gate away from the substrate; and
   a second power supply structure electrically connected with the third electrode and disposed between the second conductive line unit and the third electrode, an orthographic projection of the second power supply structure on the substrate covering an orthographic projection of the second conductive line unit on the substrate.

2. The display panel of claim 1, further comprising:
   a first auxiliary power supply structure disposed between the first gate and the first conductive line unit,
   the first power supply structure being electrically connected with the first auxiliary power supply structure.

3. The display panel of claim 1, further comprising:
   a first capacitor comprising a first electrode plate and a second electrode plate, the first electrode plate and the first gate being arranged in a same layer, and the second electrode plate being disposed between the first gate and the first conductive line unit,
   the first power supply structure being electrically connected with the second electrode plate.

4. The display panel of claim 1, further comprising:
   a second auxiliary power supply structure disposed between the second gate and the second conductive line unit,
   the second power supply structure being electrically connected with the second auxiliary power supply structure.

5. The display panel of claim 1, further comprising:
   a second capacitor disposed in the second display area and comprising a third electrode plate and a fourth electrode plate, the third electrode plate and the second gate being arranged in a same layer, and the fourth electrode plate being disposed between the second gate and the second conductive line unit, the second power supply structure being electrically connected with the fourth electrode plate.

6. The display panel of claim 1, wherein the display panel further comprises a transition display area disposed between the first display area and the second display area, and the first driving transistor is disposed in the transition display area.

7. The display panel of claim 6, further comprising:
a third light-emitting element disposed on the substrate and disposed in the transition display area, the third light-emitting element comprising a fifth electrode, a third light-emitting layer disposed on the fifth electrode, and a sixth electrode disposed on the third light-emitting layer;
a third driving transistor disposed in the transition display area and disposed between the substrate and the third light-emitting element, the third driving transistor being electrically connected with the third light-emitting element and comprising a third gate;
a third conductive line unit electrically connected with the third gate and disposed on a side of the third gate away from the substrate; and
a third power supply structure electrically connected with the fifth electrode and disposed between the third conductive line unit and the fifth electrode, an orthographic projection of the third power supply structure on the substrate covering an orthographic projection of the third conductive line unit on the substrate.

8. The display panel of claim 7, further comprising:
a third auxiliary power supply structure disposed between the third gate and the third conductive line unit,
wherein the third power supply structure is electrically connected with the third auxiliary power supply structure.

9. The display panel of claim 7, further comprising:
a third capacitor disposed in the transition display area and comprising a fifth electrode plate and a sixth electrode plate, the fifth electrode plate and the third gate being arranged in a same layer, and the sixth electrode plate being disposed between the third gate and the third conductive line unit,
wherein the third power supply structure is electrically connected with the sixth electrode plate.

10. The display panel of claim 7, wherein the first power supply structure, the second power supply structure, and the third power supply structure are all electrically connected to a reset signal terminal;
the first power supply structure, the second power supply structure, and the third power supply structure are all anode power supply structures.

11. The display panel of claim 1, wherein an orthographic projection of the first light-emitting layer on the substrate comprises one first graphic unit or at least two first graphic units jointed together, and the first graphic unit comprises at least one selected from a group comprising a round shape, an oval shape, a dumb-bell shape, a gourd shape and a rectangle shape.

12. The display panel of claim 1, wherein an orthographic projection of the first electrode on the substrate comprises one second graphic unit or at least two second graphic units jointed together, and the second graphic unit comprises at least one selected from a group comprising a round shape, an oval shape, a dumb-bell shape, a gourd shape and a rectangle shape.

13. The display panel of claim 7, wherein an orthographic projection of the third light-emitting layer on the substrate comprises one third graphic unit or at least two third graphic units jointed together, and the third graphic unit comprises at least one selected from a group comprising a round shape, an oval shape, a dumb-bell shape, a gourd shape and a rectangle shape.

14. The display panel of claim 7, wherein an orthographic projection of the fifth electrode on the substrate comprises one fourth graphic unit or at least two fourth graphic units jointed together, and the fourth graphic unit comprises at least one selected from a group comprising a round shape, an oval shape, a dumb-bell shape, a gourd shape and a rectangle shape.

15. A display apparatus comprising the display panel of claim 1.

* * * * *